(12) United States Patent
Shimomura et al.

(10) Patent No.: US 7,990,170 B2
(45) Date of Patent: Aug. 2, 2011

(54) ELECTROSTATIC DISCHARGE WITHSTAND VOLTAGE EVALUATING DEVICE AND ELECTROSTATIC DISCHARGE WITHSTAND VOLTAGE EVALUATING METHOD

(75) Inventors: Narakazu Shimomura, Gojo (JP); Toshio Mimoto, Nara (JP); Koichi Kamiyama, Nara (JP)

(73) Assignee: Sharp Kabushiki Kaihsa, Osaka (JP)

( * ) Notice: Subject to any disclaimer, the term of this patent is extended or adjusted under 35 U.S.C. 154(b) by 209 days.

(21) Appl. No.: 12/311,857

(22) PCT Filed: Oct. 17, 2007

(86) PCT No.: PCT/JP2007/070259
§ 371 (c)(1),
(2), (4) Date: Apr. 16, 2009

(87) PCT Pub. No.: WO2008/047837
PCT Pub. Date: Apr. 24, 2008

(65) Prior Publication Data
US 2010/0301892 A1    Dec. 2, 2010

(30) Foreign Application Priority Data

Oct. 20, 2006    (JP) .................................. 2006-286903

(51) Int. Cl.
*G01R 31/26* (2006.01)
(52) U.S. Cl. .............................. 324/760.01; 324/762.01
(58) Field of Classification Search ............. 324/762.01, 324/760.01
See application file for complete search history.

(56) References Cited

U.S. PATENT DOCUMENTS 4,636,724 A    1/1987 Fukuda et al.
(Continued)

FOREIGN PATENT DOCUMENTS

CN    1576868    2/2005
(Continued)

OTHER PUBLICATIONS

PCT/ISA/210.

*Primary Examiner* — Ha Tran T Nguyen
*Assistant Examiner* — Joshua Benitez
(74) *Attorney, Agent, or Firm* — Harness, Dickey & Pierce, P.L.C.

(57) ABSTRACT

In one embodiment of the present invention, an electrostatic discharge withstand voltage evaluating device includes: an application device, including a first connecting section and a second connecting section, for supplying pulse electric charge, the first connecting section being connectable to one or whole terminal (s) of one of input terminals and output terminals of a source driver, and supplying electric charge to the source driver, the second connecting section being connectable to one or whole terminal(s) of the other one of the input terminals and the output terminals, and enabling said one or whole terminal(s) of the other one of the input terminals and the output terminals to be grounded; and a common connecting section being connectable to the plurality of output terminals of the source driver, and causing the plurality of output terminals to be electrically connected to each other, wherein the output terminals of the source driver are connected, via the common connecting section, to one of the first connecting section and the second connecting section. Therefore, the electrostatic discharge withstand voltage evaluating device can more successfully recreate how a failure occurs in a semiconductor device and can evaluate an electrostatic discharge breakdown withstand of the semiconductor device.

13 Claims, 11 Drawing Sheets

U.S. PATENT DOCUMENTS

| | | | |
|---|---|---|---|
| 5,027,174 A * | 6/1991 | Mimoto | 257/665 |
| 5,159,369 A | 10/1992 | Hashimoto | |
| 5,608,558 A | 3/1997 | Katsumi | |
| 5,668,032 A * | 9/1997 | Holmberg et al. | 438/149 |
| 5,828,222 A | 10/1998 | Chen | |
| 6,791,632 B2 * | 9/2004 | Lee et al. | 349/40 |
| 7,081,770 B2 * | 7/2006 | Lee et al. | 324/760.01 |
| 7,132,846 B2 * | 11/2006 | Kim et al. | 324/756.05 |
| 7,304,492 B2 * | 12/2007 | Shiau et al. | 324/760.02 |
| 7,358,756 B2 * | 4/2008 | Kim et al. | 324/750.3 |
| 7,362,124 B2 * | 4/2008 | Kim et al. | 324/760.02 |
| 7,532,265 B2 * | 5/2009 | Tsai et al. | 349/40 |
| 7,619,436 B2 * | 11/2009 | Kwak | 324/760.02 |
| 7,843,208 B2 * | 11/2010 | Kwak | 324/760.02 |
| 2005/0017745 A1 | 1/2005 | Ito | |
| 2005/0122297 A1 | 6/2005 | Imagawa et al. | |
| 2006/0261842 A1 * | 11/2006 | Lee et al. | 324/770 |

FOREIGN PATENT DOCUMENTS

| | | |
|---|---|---|
| JP | 57-80577 | 5/1982 |
| JP | 3-163372 | 7/1991 |
| JP | 4-20882 | 1/1992 |
| JP | 10-142277 | 5/1998 |
| JP | 2001-296560 | 10/2001 |
| JP | 2002-372560 | 12/2002 |
| TW | 366424 | 8/1999 |
| TW | 2005-19394 | 6/2005 |

* cited by examiner

LIGHT

ELECTROSTATIC DISCHARGE WITHSTAND VOLTAGE EVALUATING DEVICE AND ELECTROSTATIC DISCHARGE WITHSTAND VOLTAGE EVALUATING METHOD

TECHNICAL FIELD

The present invention relates to an electrostatic discharge withstand voltage evaluating device and an electrostatic discharge withstand voltage evaluating method.

BACKGROUND ART

An electronic device (semiconductor device) has been widely used in various electronic equipments. The electronic device is sometimes charged with static electricity, while it is in a process of production or while it is mounted on an electric equipment. Discharge of the static electricity can cause a breakdown of the electronic device. In view of the circumstances, when designing the electronic device, it is necessary to secure sufficient withstand static electricity.

In recent years, an electronic device such as a source driver LSI or a gate driver LSI has been used in a large liquid crystal panel. This causes the electronic device to have been developed so as to have multiple output terminals. At the same time, for the purpose of cost reduction, the electronic device has been miniaturized so that a chip of the electronic device can be reduced in size. This causes a protection element, a power supply line, and a GND line to be reduced in size, width, and thickness. As a result, an electrostatic discharge breakdown of the electronic device becomes easy to occur.

In regard to a car-mounted display device and the like, a semiconductor element is required to have a much more strict standard. In view of this, an electrostatic discharge withstand voltage evaluating device and an electrostatic discharge withstand voltage evaluating method have grown in importance in an electrostatic discharge breakdown test.

In the electrostatic discharge breakdown test, an electrostatic discharge of the electronic device is simulated for the purpose of measuring electrostatic discharge breakdown withstand of the electronic device. The electrostatic discharge breakdown test measures the electrostatic discharge breakdown withstand of the electronic device by preparing a model for recreating how the electrostatic discharge breakdown occurs.

Source models of the electrostatic discharge breakdown are roughly classified in accordance with a contributing factor causing the electrostatic discharge breakdown, into HBM (human-body model), CDM (charged-device model), and MM (machine model).

In the HBM and MM, the electronic device is not electrically charged itself. In the HBM and MM, an electrostatic discharge breakdown occurs in the electronic device in response to an occurrence of electric discharge caused by direct contact of other object (such as human or machine) with a terminal of the electronic device.

In the CDM, an electrostatic discharge breakdown occurs in the electronic device in response to an occurrence of electric discharge caused by direct contact of an external conductor with a terminal of the electronic device, while the electronic device itself is electrically charged by a friction, a dielectric charging, or direct contact with an electrically-charged body.

As described above, at the time of designing, an electronic device is subjected to a measurement of electrostatic discharge breakdown withstand with the use of an evaluating device that recreates any one of the above-mentioned breakdown models. By this measurement, it is confirmed that no electrostatic discharge breakdown has occurred in the electronic device in a process of production of the electronic device or while the electronic device is mounted on an electronic equipment.

Such a method for evaluating an electrostatic discharge breakdown withstand of a semiconductor device by recreating any one of the breakdown models is disclosed in Patent Literature 1, for example. A conventional method for evaluating a semiconductor device and the conventional method of Patent Literature 1 are described below with reference to FIGS. 11 and 12.

FIG. 11 is a view illustrating a conventional arrangement for evaluation of the HBM and MM.

In a semiconductor device 201, a reference terminal (external electrode 202a) and a measuring terminal (external electrode 202d) are selected from external electrodes 202a through 202d. A switch 203 is switched to a power supply 205 so that a capacitor 204 is charged by a high voltage supplied from the power supply 205. Then, the switch 203 is switched to the semiconductor device 201 from the power supply 205 so that the capacitor 204 causes electric discharge between the reference terminal and the measuring terminal of the semiconductor device 201. This causes recreation of a breakdown of the semiconductor device 201, thereby evaluating an electrostatic discharge breakdown withstand.

FIG. 12 is a view illustrating an arrangement for evaluation of the CDM suggested in Patent Literature 1.

A semiconductor device 301 includes an external electrode 302 and a contact electrode 304 that is electrically isolated from the external electrode 302 by an insulative surrounding section 303. A switch 305 is turned on so that the contact electrode 304, which is part of the semiconductor device 301, is electrically charged by a power supply 306. Then, an electric discharge occurs between the contact electrode 304 and the external electrode 302. This causes recreation of a breakdown of the semiconductor device 301, thereby evaluating an electrostatic discharge breakdown withstand.

The electrostatic discharge breakdown of an electronic device has been conventionally prevented, by carrying out the electrostatic discharge breakdown test as described above or by taking measures such as provision of a protection circuit in the electronic device.

Citation List

Patent Literature 1

Japanese Unexamined Patent Publication, Tokukaisho, No. 57-80577 (Publication Date: May 20, 1982)

SUMMARY OF INVENTION

However, in recent years, there sometimes occurs a breakdown of an electronic device which has been fully subjected to measures against the breakdown, while the electronic device is mounted on an electronic equipment in a production process of the electronic device. Especially, in a production process of a large display device such as a liquid crystal television, for example, a breakdown of a driving device for a display panel of a display such as a liquid crystal display or a plasma display has been sometimes occurred.

For example, in a display panel of a liquid crystal display (hereinafter referred to as "liquid crystal panel"), a plurality of source lines and a plurality of gate lines are provided in a mesh manner. Further, a driving LSI is provided so as to supply electric currents to the plurality of source lines and the plurality of gate lines.

In a production process of the liquid crystal panel, when peeling off a laminate film, which is attached to a surface of the liquid crystal panel for protection, the surface becomes electrically charged. This electric charge is applied to an output terminal of the driving LSI via the source lines and gate lines of the liquid crystal panel.

At this point, a contact between other object and an input terminal of the driving LSI in operation or during measurement causes the liquid crystal panel to be electrically discharged. Specifically, the electric charge of the liquid crystal panel passes through the driving LSI via the output terminal of the driving LSI, and reaches said other object via the input terminal of the driving LSI. This causes an electrostatic discharge breakdown of the driving LSI.

It is considered that a charged display panel such as the liquid crystal panel is discharged via all output terminals of a driving IC of the display panel. In a case of a particularly large display panel which has a large electric capacitance, the charged amount becomes large. As such, the charged amount, contributing to electric discharge which is carried out via all of the output terminals of the driving IC, corresponds to an extremely large energy.

In a 37-inch liquid crystal display, for example, an amount of electric charge, generated while a laminate film is peeled off from a display panel, is several hundred nC to several thousand nC. This is extremely larger than an amount of electric charge generated in each of HBM and MM. The amounts of electric charge generated in HBM and MM are several hundred nC and several ten nC, respectively.

This demonstrates that, in the production process of the large display, an amount of energy to be applied to the driving LSI of the display panel is incomparably larger than that expected in each of the conventional HBM and MM.

Therefore, it is clear that a failure mode of the large display panel differs from that of an electrostatic discharge breakdown recreated by the conventional evaluation model such as HBM, MM, or CDM in which an electric charge is applied to a certain terminal.

There arises a problem that it is difficult to evaluate a case where a high energy is applied to the output terminal of the driving LSI as described above, with the use of the conventional method for evaluating an electrostatic discharge breakdown withstand.

The present invention has been accomplished in view of the problem above, and an object of the present invention is to provide an electrostatic discharge withstand voltage evaluating device and electrostatic discharge withstand voltage evaluating method that can more successfully recreate how a failure occurs in a semiconductor device and can evaluate an electrostatic discharge breakdown withstand of the semiconductor device.

In order to attain the object, an electrostatic discharge withstand voltage evaluating device of the present invention is an electrostatic discharge withstand voltage evaluating device for evaluating an electrostatic discharge withstand voltage of a measuring object device that includes a plurality of input terminals and a plurality of output terminals, the electrostatic discharge withstand voltage evaluating device including: application means, including a first connecting section and a second connecting section, for supplying pulse electric charge, the first connecting section being connectable to one or whole terminal(s) of one of the plurality of input terminals and the plurality of output terminals, and supplying electric charge to the measuring object device, the second connecting section being connectable to one or whole terminal(s) of the other one of the plurality of input terminals and the plurality of output terminals, and enabling said one or whole terminal(s) of the other one of the plurality of input terminals and the plurality of output terminals to be grounded; and a common connecting section being connectable to the plurality of the output terminals of the measuring object device, and causing the plurality of output terminals to be electrically connected to each other, the plurality of output terminals of the measuring object device being connected, via the common connecting section, to one of the first connecting section and the second connecting section.

In this arrangement, the plurality of output terminals of the measuring object device are connected, via the common connecting section, to one of the first connecting section and the second connecting section; and the second connecting section is connectable to one or whole terminal(s) of the other one of the plurality of input terminals and the plurality of output terminals, and enables said one or whole terminal(s) to be grounded. Therefore, the electric charge moves from the first connecting section to the measuring object device.

For example, in a case where the plurality of output terminals of the measuring object device are connected to the first connecting section via the common connecting section, the electric charge moves to all of the plurality of the output terminals at a time, and one of the plurality of input terminals is grounded. This makes it possible to more successfully recreate a failure mode in which a breakdown is occurred when the electric charge moves to the one of the input terminals at a time and reaches the ground.

Further, it is possible to evaluate an electrostatic discharge breakdown withstand of the measuring object device with respect to each terminal which is connected to one of the first connecting section and the second connecting section, with the use of an electric charge being supplied to an internal line of the measuring object device in which the above-mentioned model is successfully recreated.

Therefore, the electrostatic discharge withstand voltage evaluating device of the present invention can more successfully recreate how a failure occurs in a measuring object device and can evaluate an electrostatic discharge breakdown withstand of the measuring object device.

Further, an electrostatic discharge withstand voltage evaluating device of the present invention is an electrostatic discharge withstand voltage evaluating device for evaluating an electrostatic discharge withstand voltage of a measuring object device that includes a plurality of input terminals and a plurality of output terminals, the electrostatic discharge withstand voltage evaluating device including: application means, including a first connecting section and a second connecting section, for supplying pulse electric charge, the first connecting section being connectable to one or whole terminal(s) of one of the plurality of input terminals and the plurality of output terminals, and supplying electric charge to the measuring object device, the second connecting section being connectable to one or whole terminal(s) of the other one of the plurality of input terminals and the plurality of output terminals, and enabling said one or whole terminal(s) of the other one of the plurality of input terminals and the plurality of output terminals to be grounded; and a common connecting section being connectable to the plurality of the output terminals of the measuring object device, and causing the plurality of output terminals to be electrically connected to each other, the plurality of output terminals of the measuring object device being connected, via the common connecting section, to one of the first connecting section and the second connecting section, the other one of the first connecting section and the second connecting section being selectively connectable to one of the plurality of input terminals.

It is preferable to arrange the electrostatic discharge withstand voltage evaluating device of the present invention so that the measuring object device is a display driving semiconductor device to be provided in a display panel.

According to this arrangement, the display driving semiconductor device to be provided in the display panel includes the plurality of output terminals and the plurality of input terminals. In a production process, for example, the display panel can be electrically charged in a whole area of that surface. This causes the electric charge to be supplied at a time to all of the plurality of output terminals of the display driving semiconductor device. At this point, in a case where any one of the input terminals of the display driving semiconductor device is grounded for some reason, the electric charge is discharged via the one of the input terminals. This results in an occurrence of such a phenomenon that the electric charge supplied to the plurality of output terminals moves, at a time, to the one of the input terminals which is grounded.

Therefore, with the arrangement, it is possible to more successfully recreate the phenomenon and to evaluate an electrostatic discharge breakdown withstand of the measuring object device.

It is preferable to arrange the electrostatic discharge withstand voltage evaluating device of the present invention so that the application means includes a capacitive element for accumulating the electric charge; in a case where the display driving semiconductor device is provided on the display panel, a capacitance of the capacitive element can be set so as to be equivalent to an electric charge amount that is accumulated while the display panel is electrically charged.

With the arrangement, the electric charge can be supplied from the capacitive element to the display driving semiconductor device via the first connecting section. Further, in a case where the display driving semiconductor device is provided in the display panel, a capacitance of the capacitive element can be set so as to be equivalent to an electric charge amount that is accumulated while the display panel is electrically charged. This allows generation of electric charge amount equivalent to an electric charge amount that is supplied to the display driving semiconductor device in a case where the display driving semiconductor device is practically provided in the display panel and is electrically charged. This makes it possible to more successfully recreate how a failure occurs in the display driving semiconductor device.

It is preferable to arrange the electrostatic discharge withstand voltage evaluating device of the present invention so that the application means includes an impedance element generating impedance that can be set so as to be equivalent to internal impedance of the display panel in the case where the display driving semiconductor device is provided in the display panel.

The display panel generates the internal impedance while it is electrically charged as described above, for example.

With the arrangement, the application device includes an impedance element generating impedance that can be set so as to be equivalent to internal impedance of the display panel in the case where the display driving semiconductor device is provided in the display panel. This allows generation of electric charge equivalent to an electric charge that is supplied to the display driving semiconductor device in a case where the display driving semiconductor device is practically provided in the display panel and is electrically charged. This makes it possible to more successfully recreate how a failure occurs in the display driving semiconductor device.

It is preferable to arrange the electrostatic discharge withstand voltage evaluating device of the present invention so that the capacitance of the capacitive element is 1 pF to 1 µF. In this arrangement, the capacitive element retains an electric charge amount corresponding to that accumulated while the display panel is electrically charged in the case where the display driving semiconductor device is provided in the display panel. This makes it possible to more successfully recreate how a failure occurs in the display driving semiconductor device.

It is preferable to arrange the electrostatic discharge withstand voltage evaluating device of the present invention so that the impedance is provided by a resistor of 1Ω to 100Ω.

It is preferable to arrange the electrostatic discharge withstand voltage evaluating device of the present invention so that the electrostatic discharge withstand voltage evaluating device according to claim 7, wherein the impedance further includes an inductor of 0.1 µH to 10 µH which is connected in series.

In this arrangement, the display driving semiconductor device generates impedance corresponding to internal impedance of the display panel in the case where the display driving semiconductor device is provided in the display panel. This makes it possible to more successfully recreate how a failure occurs in the display driving semiconductor device.

In order to attain the object, an electrostatic discharge withstand voltage evaluating method of the present invention is an electrostatic discharge withstand voltage evaluating method for evaluating an electrostatic discharge withstand voltage of a measuring object device that includes a plurality of input terminals and a plurality of output terminals, the electrostatic discharge withstand voltage evaluating method including the steps of: connecting the plurality of output terminals to a common connecting section for causing the plurality of output terminals to be electrically connected to each other; and supplying pulse electric charge to one or whole terminal(s) of one of the plurality of output terminals connected to the common connecting section and the plurality of input terminals, and grounding one or whole terminal(s) of the other one of the plurality of output terminals connected to the common connecting section and the plurality of input terminals.

In this arrangement, the common connecting section for causing the plurality of output terminals to be electrically connected to each other is connected to the plurality of output terminals, and thereafter the pulse electric charge is supplied to one or whole terminal(s) of one of the plurality of input terminals and the plurality of output terminals connected to the common connecting section, and one or whole terminal(s) of the other one of the plurality of input terminals and the plurality of output terminals are grounded. As a result, the pulse electric charge is supplied to the measuring object device via one or whole terminal(s) of either one of the plurality of input terminals and the plurality of output terminals connected to the common connecting section.

For example, in a case where the pulse electric charge is supplied to the plurality of output terminals via the common connecting section, the electric charge is supplied to all of the plurality of output terminals at a time, and one of the plurality of input terminals is grounded. Therefore, it is possible to more successfully recreate a failure mode in which a breakdown is occurred when the electric charge moves to the one of the plurality of input terminals at a time and reaches the ground.

Further, it is possible to evaluate an electrostatic discharge breakdown withstand of the measuring object device with respect to each terminal which is connected to one of the first connecting section and the second connecting section, with the use of an electric charge being supplied to an internal line of the measuring object device in which the above-mentioned model is successfully recreated.

Therefore, the electrostatic discharge withstand voltage evaluating device of the present invention can more successfully recreate how a failure occurs in the measuring object device and can evaluate an electrostatic discharge breakdown withstand of the measuring object device.

It is preferable to arrange the electrostatic discharge withstand voltage evaluating method of the present invention so as to further include: in a case where the pulse electric charge is supplied to the plurality of output terminals connected to the common connecting section, one of the plurality of input terminals is selectively grounded; and in a case where the plurality of output terminals connected to the common connecting section are grounded, the pulse electric charge is selectively supplied to one of the plurality of input terminals.

It is preferable to arrange the electrostatic discharge withstand voltage evaluating method of the present invention so that the measuring object device is a display driving semiconductor device to be provided in a display panel.

According to this arrangement, the display driving semiconductor device to be provided in the display panel includes the plurality of output terminals and the plurality of input terminals. In a production process, for example, the display panel can be electrically charged in a whole area of that surface. This causes the electric charge to be supplied at a time to all of the plurality of output terminals of the display driving semiconductor device. At this point, in a case where any one of the input terminals of the display driving semiconductor device is grounded for some reason, the electric charge is discharged via the one of the input terminals. This results in an occurrence of such a phenomenon that the electric charge supplied to the plurality of output terminals moves, at a time, to the one of the input terminals which is grounded.

With the arrangement, it is possible to more successfully recreate the phenomenon and to evaluate an electrostatic discharge breakdown withstand of the measuring object device.

As described above, the electrostatic discharge withstand voltage evaluating device of the present invention is arranged so as to include: application means, including a first connecting section and a second connecting section, for supplying pulse electric charge, the first connecting section being connectable to one or whole terminal(s) of one of the plurality of input terminals and the plurality of output terminals, and supplying electric charge to the measuring object device, the second connecting section being connectable to one or whole terminal(s) of the other one of the plurality of input terminals and the plurality of output terminals, and enabling said one or whole terminal(s) of the other one of the plurality of input terminals and the plurality of output terminals to be grounded; and a common connecting section being connectable to the plurality of the output terminals of the measuring object device, and causing the plurality of output terminals to be electrically connected to each other, the plurality of output terminals of the measuring object device being connected, via the common connecting section, to one of the first connecting section and the second connecting section.

The electrostatic discharge withstand voltage evaluating method of the present invention is arranged so as to include the steps of: connecting the plurality of output terminals to a common connecting section for causing the plurality of output terminals to be electrically connected to each other; and supplying pulse electric charge to one or whole terminal(s) of the one of the plurality of output terminals connected to the common connecting section and the plurality of input terminals, and grounding one or whole terminal(s) of the other one of the plurality of output terminals connected to the common connecting section and the plurality of input terminals.

With the arrangement, in which the electric charge is supplied to all of the plurality of output terminals at a time, and one of the input terminals is grounded, it is possible to more successfully recreate a failure model in which a breakdown is occurred when the electric current moves, at a time, to the one of the input terminals which is grounded. That is, it becomes possible to deal with a new failure mode such as the above-mentioned model.

Further, it is possible to evaluate an electrostatic discharge breakdown withstand of the measuring object device with respect to each terminal which is connected to one of the first connecting section and the second connecting section, with the use of an electric charge being supplied to an internal line of the measuring object device in which the above-mentioned model is successfully recreated.

Therefore, the electrostatic discharge withstand voltage evaluating device and electrostatic discharge withstand voltage evaluating method of the present invention can more successfully recreate how a failure occurs in a measuring device and can evaluate an electrostatic discharge breakdown withstand of the measuring object device.

Additional objects, features, and strengths of the present invention will be made clear by the description below. Further, the advantages of the present invention will be evident from the following explanation in reference to the drawings.

REFERENCE SINGS LIST

10: APPLICATION DEVICE (APPLICATION MEANS)
11: SWITCH
12: CAPACITOR (CAPACITIVE ELEMENT)
13: RESISTOR
14: INDUCTOR

15: FIRST CONNECTING SECTION
16: SECOND CONNECTING SECTION
51: COMMON CONNECTING SECTION
52: MEASURING TERMINAL
100: LIQUID CRYSTAL PANEL (DISPLAY PANEL)
108: GATE LINE
111: SOURCE LINE
115: LAMINATE FILM
120: SOURCE DRIVER (MEASURING OBJECT DEVICE, DISPLAY DRIVING SEMICONDUCTOR DEVICE)
130: GATE DRIVER (MEASURING OBJECT DEVICE, DISPLAY DRIVING SEMICONDUCTOR DEVICE)

Description of Embodiments

One embodiment of the present invention is described below with reference to FIGS. 1 through 10.

An electrostatic discharge withstand voltage evaluating device of the present embodiment is used in a reliability test for electrostatic discharge breakdown occurred in (i) a protection element of an input terminal, (ii) a power supply line and (iii) a GND line, in a display driving LSI which is provided in a display panel of a display such as a liquid crystal display panel or a plasma display panel.

The following description deals with a case where (i) a display driving LSI of a liquid crystal panel is used as an example of the display driving LSI and (ii) electrostatic discharge breakdown withstand of a source driver is evaluated. It should be noted that the electrostatic discharge withstand voltage evaluating device of the present embodiment evaluates the electrostatic discharge breakdown withstand by recreating how a failure occurs in the source driver.

For better understanding, an arrangement of a liquid crystal panel including a source driver is briefly described at first, and an example, in which a failure occurs in the source driver in a practical production process, is subsequently described. Finally described is a method for evaluating the electrostatic discharge breakdown withstand with the use of the electrostatic discharge withstand voltage evaluating device of the present embodiment that recreates how the failure occurs.

First, an arrangement of the liquid crystal panel including the source driver is described below with reference to FIGS. 4 and 5.

Figure 4:
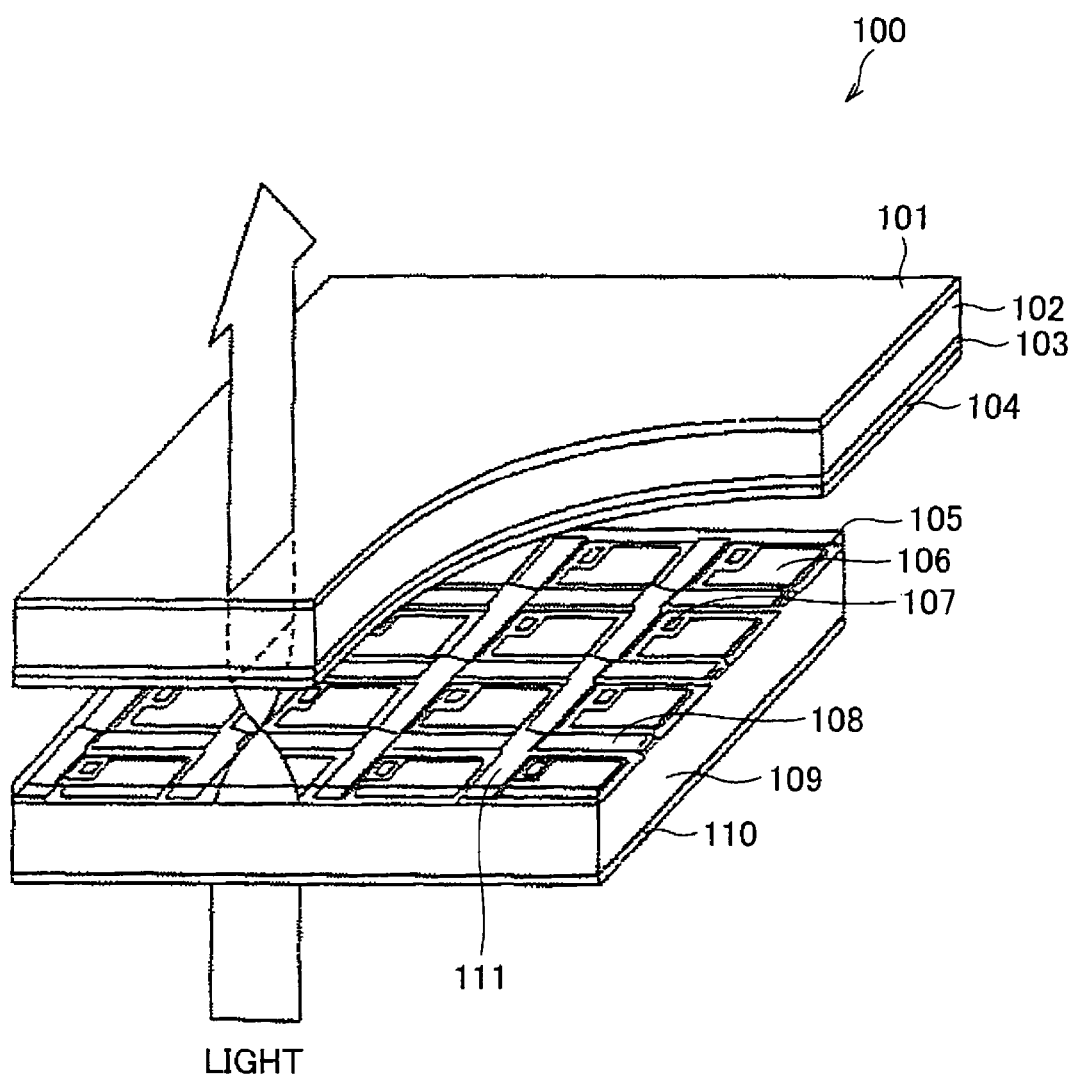
FIG. 4 is a perspective view illustrating an internal arrangement of a liquid crystal panel.

FIG. 4 is a perspective view illustrating an arrangement of a liquid crystal panel 100.

Figure 5:
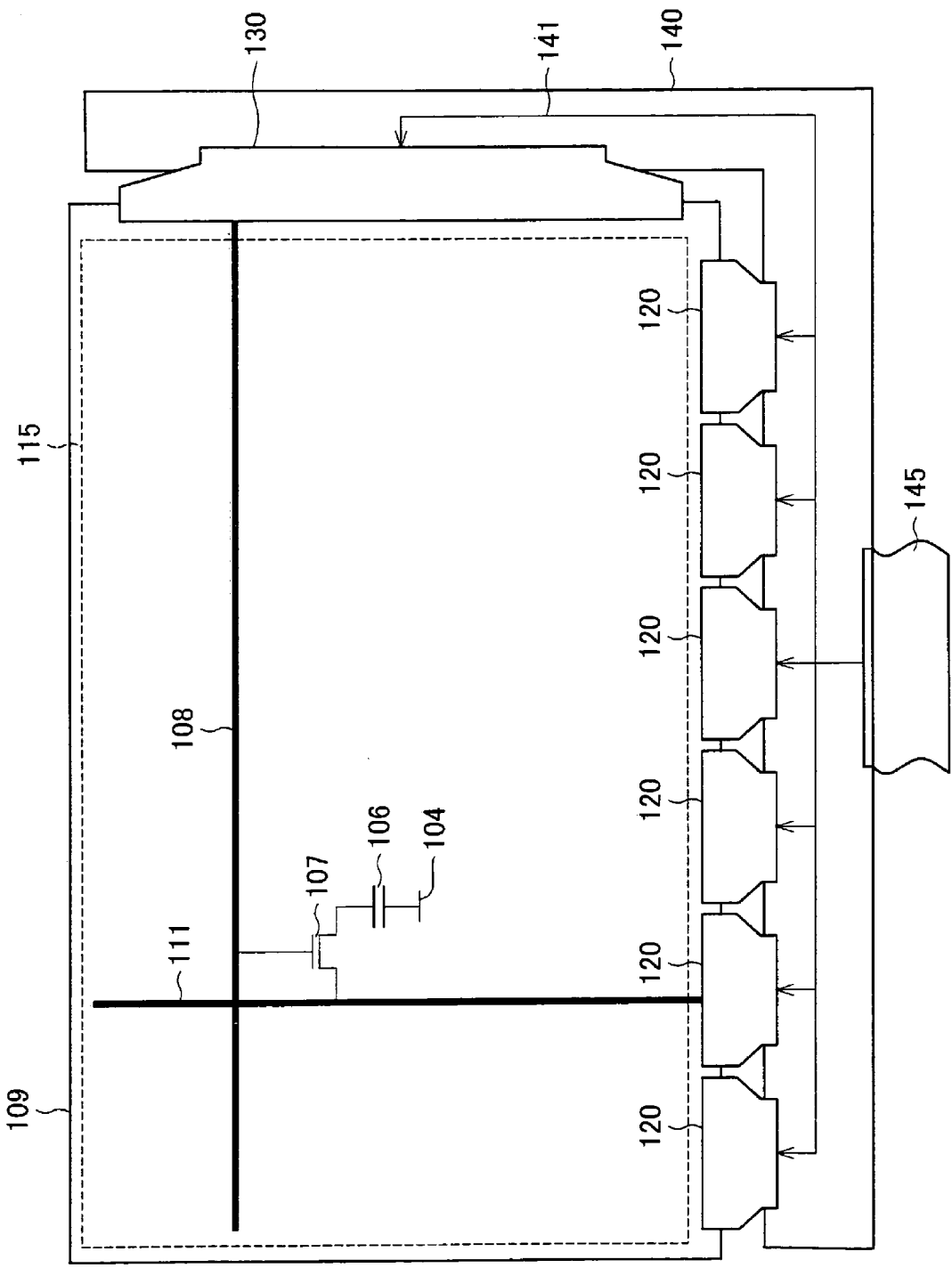
FIG. 5 is a block diagram illustrating a connection arrangement of a liquid crystal panel.

FIG. 5 is a block diagram illustrating a glass substrate 109 obtained when it is viewed in a direction perpendicular to a surface on which active elements (TFT) 107 are provided. For the purpose of simplification, FIG. 5 shows a single TFT 107, a single gate line 108, a single source line 111, and a single wire 141 of display control signal, power source, and GND. Note however that the liquid crystal panel 100 actually includes plural number for each of these components.

As shown in FIG. 4, the liquid crystal panel 100 is arranged so that a polarizing plate 101, a glass substrate 102, a color filter (RGB) 103, a counter electrode 104, an alignment film 105, a pixel electrode 106, a glass substrate 109, and a polarizing plate 110 are stacked on a display surface in the order of being close to the display surface.

The liquid crystal panel 100 adopts an active matrix driving system. Therefore, the TFTs 107, the gate lines 108, and the source lines 111 are provided on the glass substrate 109 so that voltages are applied to the pixel electrodes 106, respectively.

As shown in FIG. 5, each of the TFTs 107 includes a drain connected to a pixel electrode 106, a source connected to a source line 111, and a gate connected to a gate line 108. The TFTs 107 are provided in a matrix manner, and a gate line 108 and a source line 111 extend between adjacent two of the TFTs 107, so that the gate lines 108 and the source lines 111 are provided in a mesh manner.

With the arrangement, each of the TFTs 107 turns on in response to an electrical signal supplied via its gate line 108 so as to supply, to its corresponding pixel electrode 106, an electrical signal supplied via its source line 111. The electrical signal thus supplied to the pixel electrode 106 is held by the pixel electrode 106 in terms of a voltage between the counter electrode 104 and the pixel electrode 106. A transmission level of a liquid crystal between the pixel electrode 106 and the counter electrode 104 is determined in accordance with the voltage thus held, and a display is carried out in accordance with the transmission level. As shown in FIG. 4, the liquid crystal panel 100 is arranged so as to be irradiated with light from the polarizing plate 110 side and so as to display an image on the display surface on the polarizing plate 101 side.

Next, the following description deals with an arrangement in which electric signals are supplied to a gate line 108 and a source line 111, with reference to FIG. 5.

The glass substrate 109 has a plate shape, and source drivers 120 are provided on one side of the glass substrate 109 (see FIG. 5). Further, a gate driver 130 is provided on a side orthogonal to the one side of the glass substrate 109.

Each of the source drivers 120 includes a plurality of output terminals and a plurality of input terminals. The plurality of output terminals are connected to the source lines 111, respectively. Each of the input terminals is connected to the wire 141 of display control signal, power source and GND, which wire 141 is provided on a printed board (PWD) 140. FIG. 5 shows that six source drivers 120 are provided. However, the present embodiment is not limited to this. The number and size of the source drivers 120 can be changed in accordance with designing. Note that an internal arrangement of the source drivers 120 is later described in detail.

The gate driver 130 includes a plurality of output terminals and a plurality of input terminals. The plurality of output terminals are connected to the gate lines 108, respectively. Each of the input terminals is connected to the wire 141 of the display control signal, power source and GND, which wire 141 is provided on the PWD 140. FIG. 5 shows one gate driver 130. However, the present embodiment is not limited to this. The number and size of the gate drivers 130 can be changed in accordance with designing.

The wire 141 of the display control signal, power source and GND, which is provided on the PWD 140, can be connected to outside of the liquid crystal panel 100 via a film cable (FPC) 145.

As such, the wire 141 allows electrical signals to be sent/received to/from a control substrate (not shown), which is provided outside the liquid crystal panel 100, for example. On the control substrate, an element for generating the display control signal and the power source is provided.

The display control signal and the power source generated in the control substrate are supplied to the source drivers 120 and the gate driver 130 via the FPC 145 and the wire 141 provided on the PWD 140, thereby driving the liquid crystal panel 100. That is to say, the source drivers 120 and the gate driver 130 serve as a driver for the liquid crystal panel 100.

In a production process of the liquid crystal panel 100, the pixel electrodes 106, the TFTs 107, and other elements are provided on the glass substrate 109, and then laminate films 115 for surface protection are attached to front and back surfaces of the liquid crystal panel 100. Specifically, the laminate films 115 are attached to surfaces of the polarizing plate 101 and the polarizing plate 110, respectively, (see FIG. 4) so as to cover a region shown in FIG. 5.

Then, the source drivers 120 and the gate driver 130 are pressure-bonded to the glass substrate 109 so that the output terminals of the source drivers 120 are connected to the source lines 111, respectively; and the output terminals of the gate driver 130 are connected to the gate lines 108, respectively.

Then, a laminate film 115 that has been attached to the liquid crystal panel 100 thus processed is peeled off, and thereafter the FPC 145 is connected to the control substrate so that the liquid crystal panel 100 is subjected to an operation check.

At this time, when the FPC 145 is connected to the control substrate after the laminate film 115 is peeled off, a failure may occur in some of the source drivers 120 and the gate driver 130.

The following description deals with, as an example, how the failure of a source driver 120 occurs, with reference to FIGS. 6 through 10. This case is a new failure mode that is not conventionally assumed.

Figure 6:
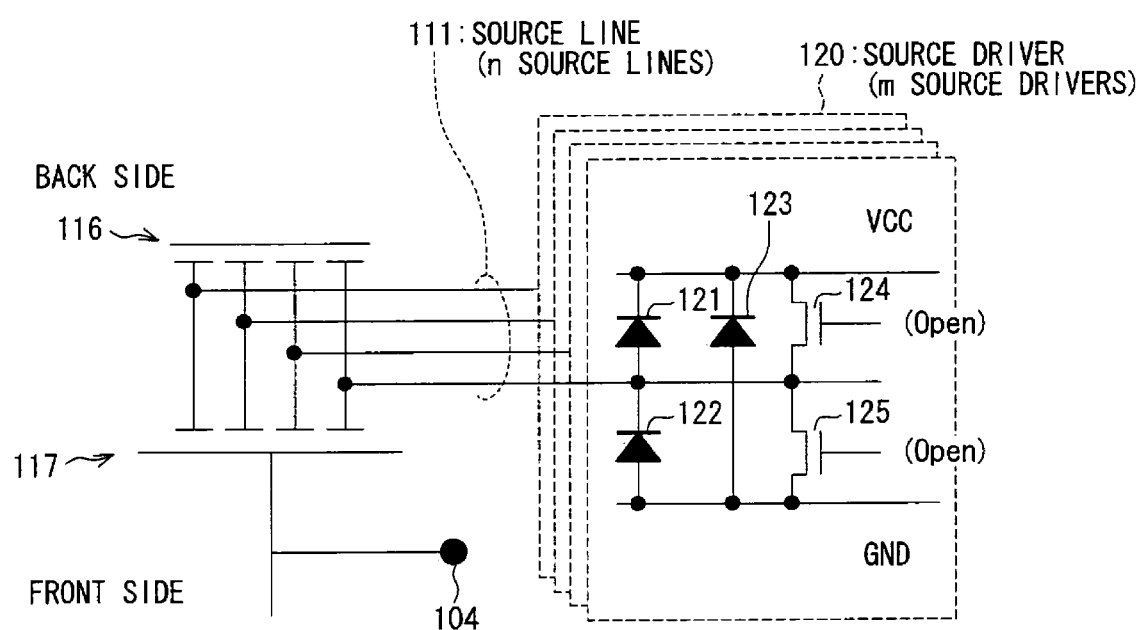
FIG. 6 is a schematic view illustrating an arrangement of the liquid crystal panel and a source driver.

FIG. 6 is a view for illustrating an arrangement of the source drivers 120 and their related components in the liquid crystal panel 100. Note that FIG. 6 shows a relation between respective of outputs of the source drivers 120 and respective of capacitances of the source lines 111, on the assumption that an incident side on which a light is incident (see FIG. 4) is a back side (back surface) of the liquid crystal panel and a side opposite to the incident side is a front side (front surface) of the liquid crystal panel.

As shown in FIG. 6, each of the source drivers 120 includes diodes 121 through 123, a CMOS 124, and a CMOS 125.

Each of the diodes 121 through 123 is used as an output protection element. The CMOS 124 and the CMOS 125 are used as output buffers on VCC and GND sides, respectively.

Output parts of the source drivers 120 are connected to the source lines 111, respectively. FIG. 6 shows that m number of the source drivers 120 are connected to n total number of the source lines 111.

As shown in FIG. 4, the source lines 111 are provided between the glass substrate 109 and the counter electrode 104.

Therefore, there exist a capacitor between respective of the source lines 111 and the glass substrate 109 (source line-glass substrate capacitor 116), and a capacitor between respective of the source lines 111 and respective of the counter electrodes 104 (source line-counter electrode capacitor 117).

In regard to the arrangement above, the following description deals with a case where a laminate film 115 is peeled off from the back surface.

Figure 7:
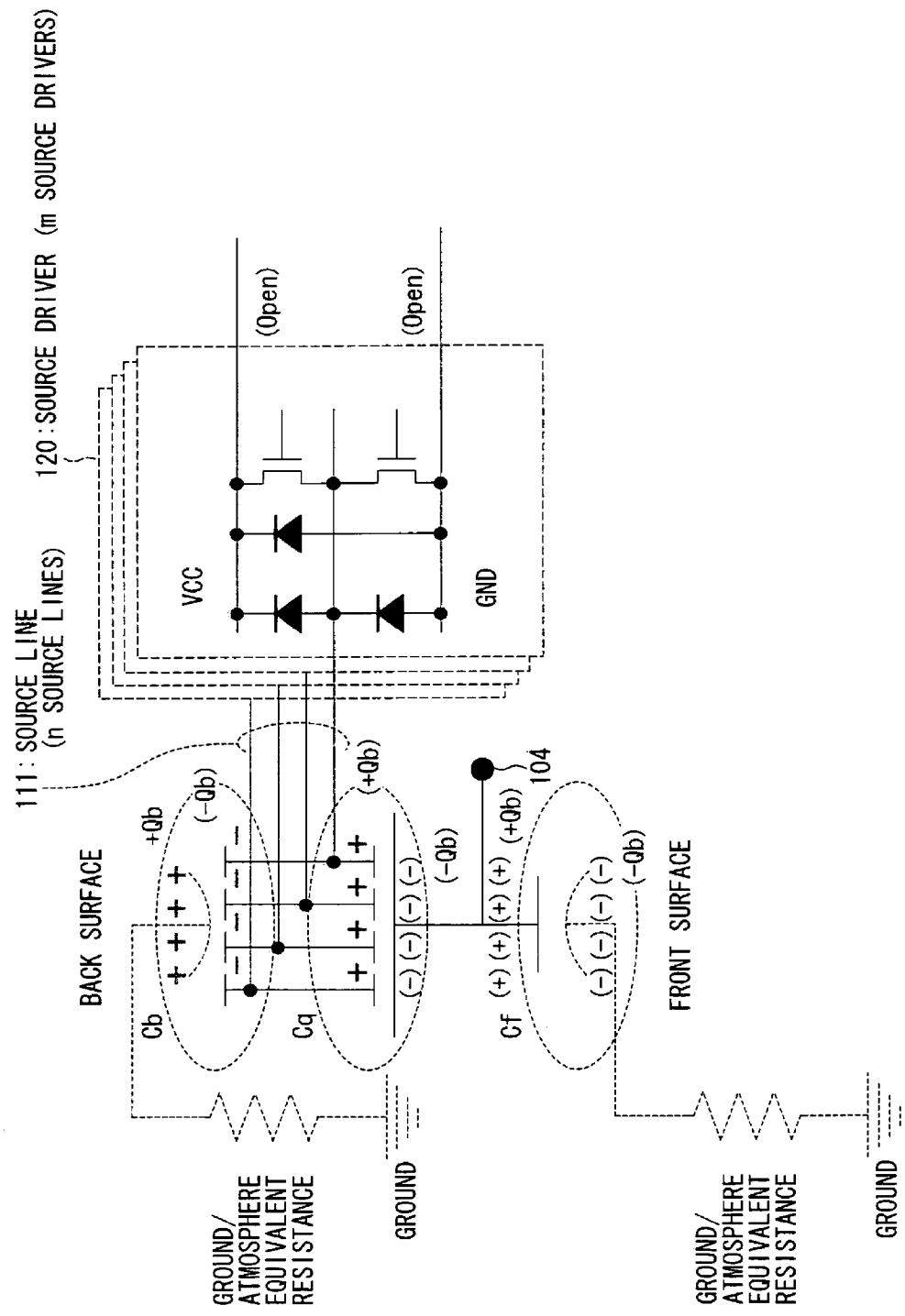
FIG. 7 is a schematic view illustrating a charging model obtained in a case where a laminate film is peeled off from a back surface.

FIG. 7 is a view illustrating a charging model obtained in a case where the laminate film 115 is peeled off from the back surface.

Peeling off the laminate film causes the polarizing plate 110 and the glass substrate 109, which are provided on the back surface side, to be electrically charged. Note that this electrostatic charge occurs even in a case where some sort of substance exists between the polarizing plate 110 and the laminate film 115. The charged amount is indicated by +Qb.

As a result, the electrostatic induction causes both front and back surfaces of the source lines 111 to be charged, so that the back surface (the glass substrate side) has a negative charge (−Qb); and the front surface (the counter electrode side) has a positive charge (+Qb).

Since the counter electrode side of the source lines 111 is positively charged, a surface of the counter electrode 104, which surface faces the source lines 111, is negatively charged (−Qb). This causes other components to be charged in the same way based on the electrostatic induction. As a result, a surface of the polarizing plate 101, which surface is exposed to air, becomes negatively charged (−Qb).

Consequently, a capacitance Cb is formed in a region between the source lines 111 and the polarizing plate 110; the source line-counter electrode capacitor 117 is a capacitance Cq; and a capacitance Cf is formed in a region between the counter electrode 104 and the polarizing plate 101.

At this point, the FPC 145 is not yet connected to the control substrate, and therefore the input terminals of the source drivers 120 are opened.

The following description deals with a case where a GND input terminal of a source driver 120 is grounded earlier than the other input terminal, when the FPC 145 is connected to the control substrate after the liquid crystal panel 100 is electrically charged as shown in FIG. 7.

Figure 8:
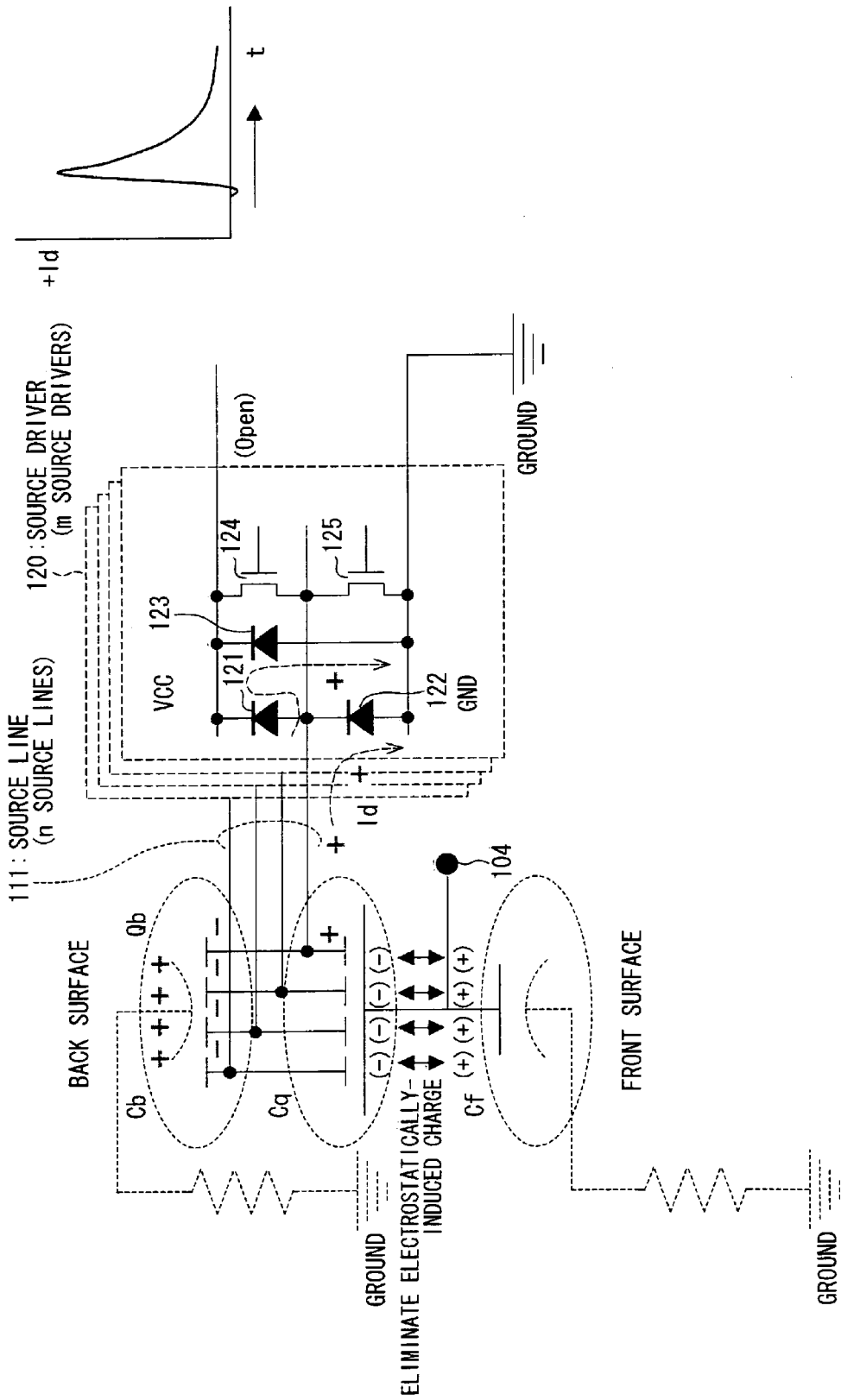
FIG. 8 is a schematic view illustrating a model in which an electric charge is discharged via a source line and a source driver.

FIG. 8 is a view illustrating a model in which the electric charge is discharged via a source line 111 and a source driver 120 in a case where the GND input terminal of the source driver 120 is grounded earlier than other input terminals.

As shown in FIG. 8, in a case where the GND input terminal of the source driver 120 is grounded earlier than the other input terminals, a positive electric charge on the source line 111 moves to an output terminal of the source driver 120, and further moves to the ground, via the diodes 121 and 123, the diode 122, and a GND line.

At this point, an electric current (Id) of several amperes to several ten amperes flows so as to decrease over time (t) as shown in a graph at the upper right in FIG. 8. The electric charge moves in a pulsed manner. The number of the output terminals of the source drivers 120 connected to the source lines 111 is n in total. In addition, it is conceivable that electric discharge occurs via the gate driver 130. Therefore, a charged amount which is discharged via a source line 111 becomes equal to or less than 1/n of charged amount of the entire liquid crystal panel.

Therefore, the output protection elements (i.e. diodes 121 through 123), which have been confirmed, by a conventional electrostatic discharge breakdown withstand evaluation method, not to be broken, would not be broken down.

However, the electric charge moves to the GND line of the source driver 120 from each of the output terminals at a time. This causes a breakdown of a part of the GND line, which part does not have a sufficient current capacity. That is to say, the electrostatic discharge breakdown occurs due to the pulse movement of the electric charge. Meanwhile, the negative electric charge is retained by the source lines 111.

The following description deals with a case where a VCC input terminal of a source driver 120 is grounded earlier than other input terminals, when the FPC 145 is connected to the control substrate after the liquid crystal panel 100 is electrically charged as shown in FIG. 7.

Figure 9:
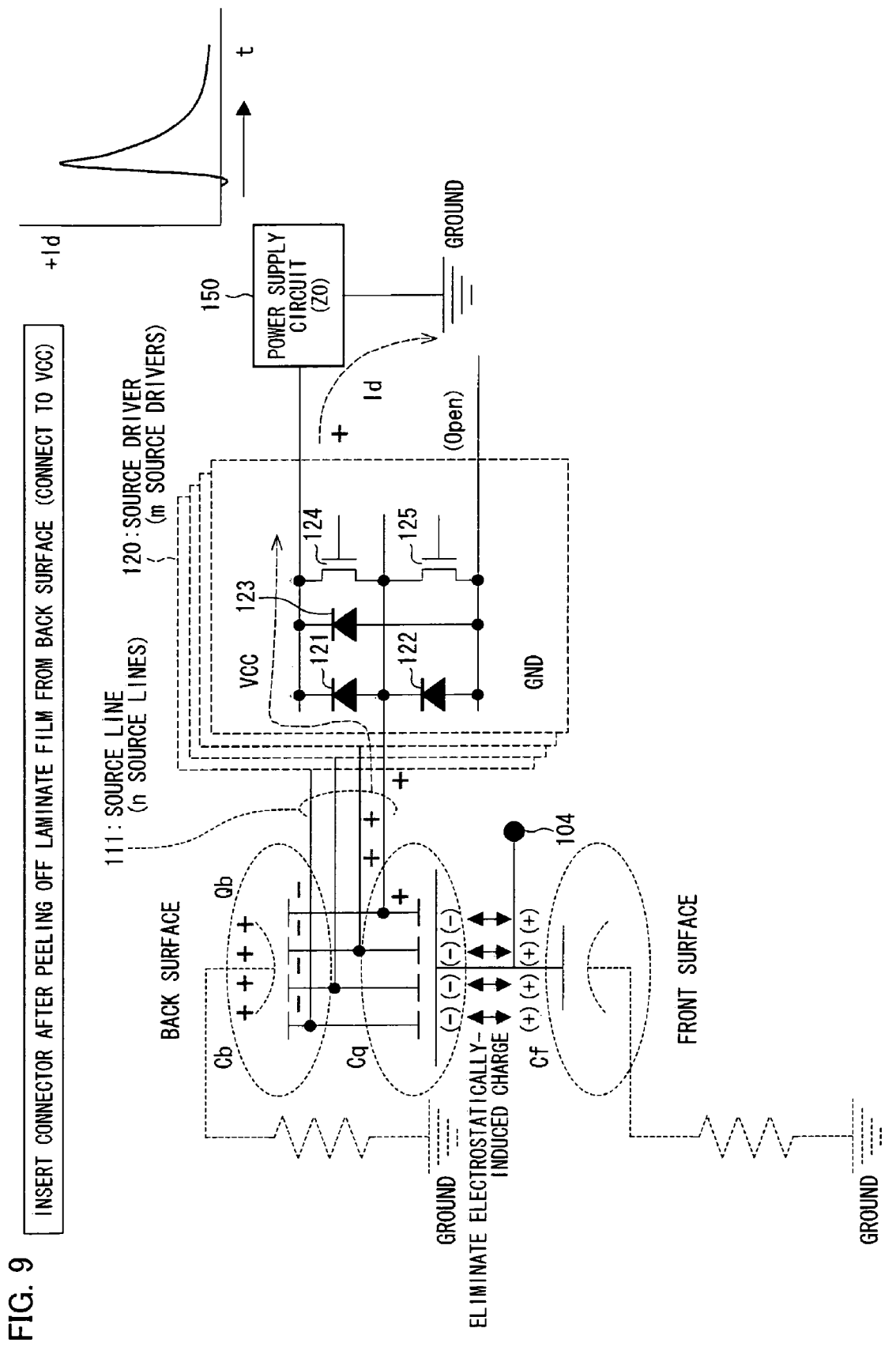
FIG. 9 is a schematic view illustrating another model in which an electric charge is discharged via a source line and a source driver.

FIG. 9 is a view illustrating a model in which the electric charge is discharged via a source line 111 and a source driver 120, in a case where the VCC input terminal of the source driver 120 is grounded earlier than other input terminals.

As shown in FIG. 9, in a case where the VCC input terminal of the source driver 120 is grounded earlier than the other input terminals, a positive electric charge on the source line 111 moves to an output terminal of the source driver 120, enters a VCC line by mainly passing through the diode 121 whose power supply direction corresponds to a forward direction of the electric charge, and further moves to the ground via a power supply circuit 150 of the control substrate. Note that impedance of the power supply circuit 150 is set to 0.

In the same way as the case where the GND input terminal is grounded earlier than the other input terminals as shown in FIG. 8, the electric charge moves to the VCC line of the source driver 120 from each of the output terminals at a time. This causes a breakdown of a part of the VCC line, which part does not have a sufficient current capacity. Meanwhile, the negative electric charge is retained by the source lines 111.

The following description deals with a case where a certain input terminal of a source driver 120 is grounded earlier than other pins, when the FPC 145 is connected to the control substrate after the liquid crystal panel 100 is electrically charged as shown in FIG. 7.

Figure 10:
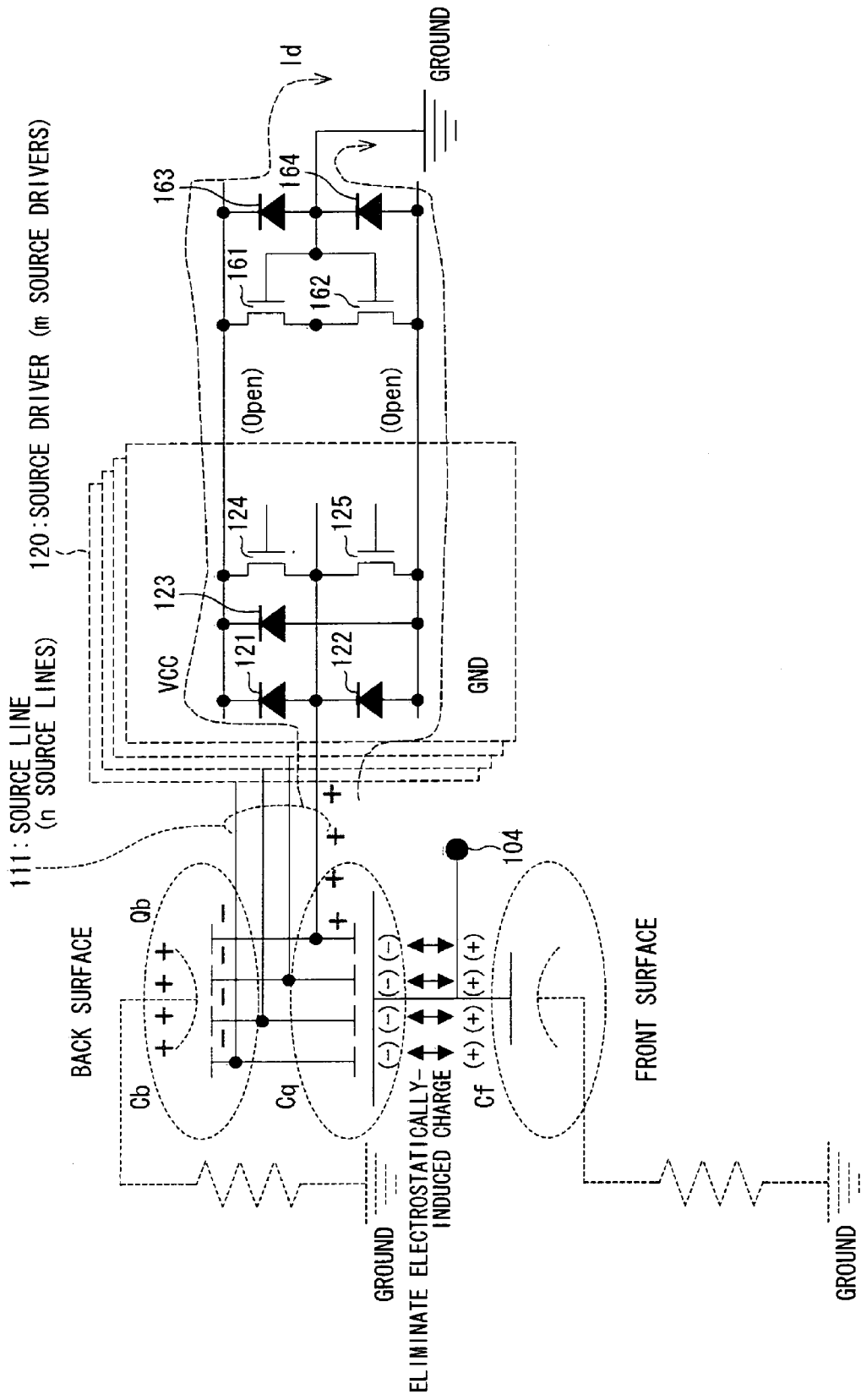
FIG. 10 is a schematic view illustrating still another model in which an electric charge is discharged via a source line and a source driver.
Figure 11:
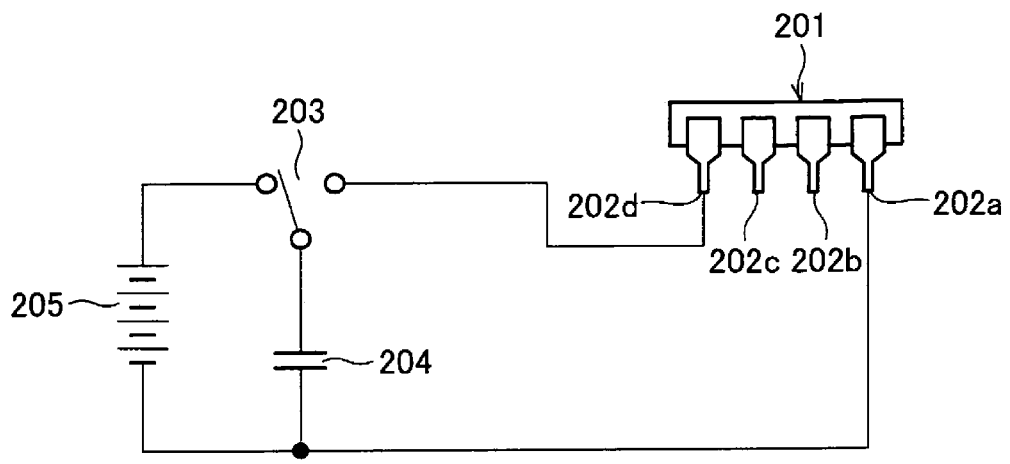
FIG. 11 is a block diagram illustrating an arrangement for evaluation of conventional HBM and MM.
Figure 12:
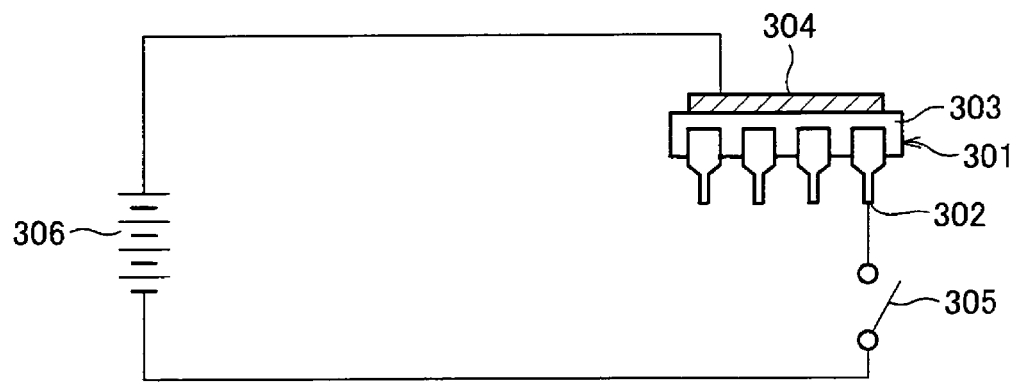
FIG. 12 is a block diagram illustrating an arrangement for evaluation of a conventional CDM.

FIG. 10 is a view illustrating a model in which the electric charge is discharged via a source line 111 and a source driver 120, in a case where the certain input terminal of the source driver 120 is grounded earlier than the other input terminals.

As shown in FIG. 10, the source driver 120 includes, on the input terminal side, transistors 161 and 162 each serving as an input buffer, and diodes 163 and 164 each serving as an input protection element.

As shown in FIG. 10, in a case where the certain input terminal of the source driver 120 is grounded earlier than other input terminals, a positive electric charge on the source line 111 moves to an output terminal of the source driver 120, passes through a VCC line and a GND line via diodes 121 through 123, enters the certain input terminal via the diodes 163 and 164, and further moves to the ground.

At this time, the electric charge moves to the VCC line and the GND line of the source driver 120 from each of the output terminals at a time. Accordingly, an electric current or voltage generated by the electric charge is applied to the input protection elements. This causes a breakdown of a part of the input protection elements, which part does not have a sufficient current capacity or has a low withstand voltage.

In the above-mentioned case, the positive electric charge of all of the source lines 111 concurrently moves to the certain input terminal. This causes a failure which is the worst situation for the input protection elements. Meanwhile, the negative electric charge is retained by the source lines 111.

It is also possible to describe, with the use of a similar model, a movement of electric charge (i) in a case where the liquid crystal panel 100 is charged to have a polarity reverse to that shown in FIGS. 6 through 10, (ii) in a case where the laminate film 115 on the front surface is peeled off, or (iii) in a case where electrostatic discharge occurs in the gate driver 130.

Figure 1:
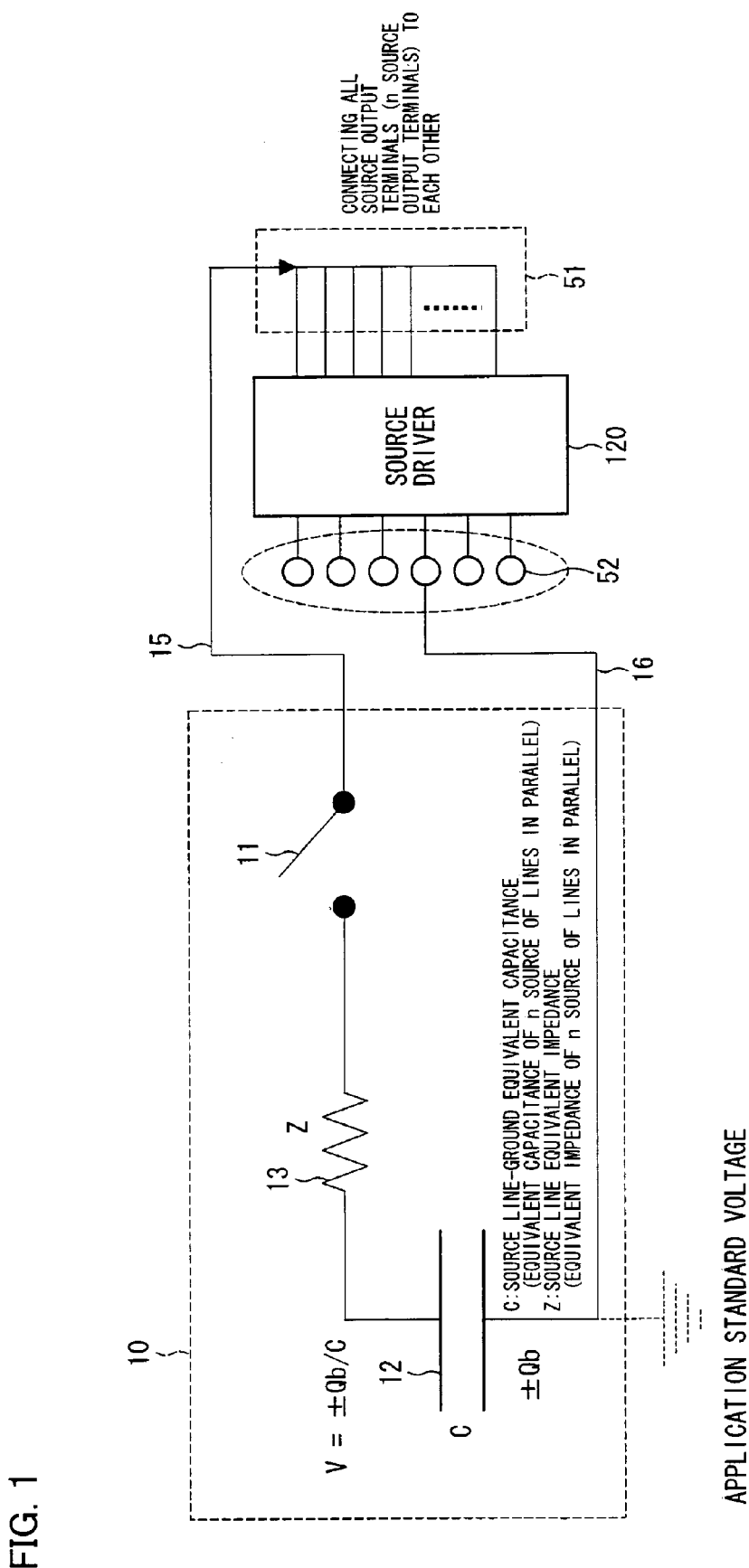
FIG. 1 is a block diagram illustrating one embodiment of an electrostatic discharge withstand voltage evaluating device of the present invention.

Described below with reference to FIG. 1 is an arrangement of an electrostatic discharge withstand voltage evaluating device of the present embodiment, which recreates how a failure occurs in a source driver 120.

FIG. 1 is a block diagram illustrating an arrangement of an electrostatic discharge withstand voltage evaluating device in accordance with the present embodiment.

The electrostatic discharge withstand voltage evaluating device of the present embodiment evaluates an electrostatic discharge withstand voltage of a measuring object device, by applying an electric charge to the measuring object device. As shown in FIG. 1, the electrostatic discharge withstand voltage evaluating device includes an application device 10 (application means) for generating electric charge, and a source driver 120 serving as the measuring object device.

The application device 10 is an ESD simulator known as a simulator device that generates an electrostatic pulse. The electrostatic pulse means pulse electric charge. The application device 10 includes a switch 11, a capacitor 12 (capacitive element), a resistor 13, a first connecting section 15, and a second connecting section 16.

The switch 11 is for switching on/off of the electric charge which is generated from the application device 10. The switch 11 is connected to one electrode of the resistor 13, and the other electrode of the resistor 13 is connected to the capacitor 12.

The capacitor 12 discharges the charge which is charged by the power source (not shown) so as to generate a voltage which causes the application device 10 to generate the pulse voltage. A capacitance of the capacitor 12 is set so as to become equivalent to a capacitance (source line-ground equivalent capacitance C) formed between the ground and the source lines 111. That is, when the number of the source lines 111 is n, the source line-ground equivalent capacitance C is the sum of electrostatic capacitance formed between respective of components facing the n source lines 111 and respective of the n source lines 111.

Specifically, in a case where a source driver 120 is actually provided on a liquid crystal panel 100 (predetermined device), the capacitance of the capacitor 12 is set so as to be equivalent to an electric charge amount that is accumulated while a source line 111, connected to an output terminal of the source driver 120, is charged based on the electrostatic induction due to charging of a polarizing plate 110 and a glass substrate 109 or due to charging of a polarizing plate 101 and a glass substrate 102, each of the polarizing plates 110 and 101 and the glass substrates 109 and 102 being connected to the ground via air. That is to say, the capacitance of the capacitor 12 is set so as to be equivalent to an electric charge amount that is accumulated while the liquid crystal panel 100 is electrically charged.

The predetermined device herein means a device on which a measuring object device is assumed to be mounted. In a case where the source driver 120 is a measuring object device, the device on which the source driver 120 is assumed to be mounted is the liquid crystal panel 100, for example.

For example, as described above, when the laminate film 115 is peeled off from the back surface of the liquid crystal panel 100, the electric charge is ±Qb as shown in FIG. 7. An electric charge amount of the capacitor 12 can be set to ±Qb, in a case of intending to evaluate an electrostatic discharge breakdown withstand voltage of the source driver 120 occurred when the electric charge ±Qb moves to the source driver 120. In this case, a voltage V=±Qb/C is generated across the capacitor 12.

For evaluation of an electrostatic discharge breakdown withstand voltage in a case where the laminate film 115 is peeled off from the front surface of the liquid crystal panel 100, the electric charge amount of the capacitor 12 can be set to ±Qf. Further, for evaluation in a case where the laminate films 115 are peeled off from both of the back and front surfaces of the liquid crystal panel 100, the electric charge amount of the capacitor 12 can be set to Qb+Qf. In this regard, however, the source line-ground equivalent capacitance C needs to be determined in consideration of a potential energy at a position (at a height from the ground) of the electrically-charged liquid crystal panel.

A variable capacitor can be used as the capacitor 12. Further, it is preferable that such a variable capacitor has a capacitance which ranges from 1 pF to 1 μF. This is because it is possible to set the electric charge amount of the capacitor 12 to be equivalent to that of the source lines 111.

The resistor 13 is connected in series with the capacitor 12 so as to be provided between the capacitor 12 and the switch 11. The resistor 13 is for generating impedance (source line equivalent impedance Z) that is equivalent to internal impedance of the source line 111.

Specifically, in a case where the source driver 120 is actually provided on the liquid crystal panel 100, the resistor 13 is arranged so as to have a resistance that causes generation of impedance equivalent to the internal impedance of the source line 111 that is connected to the liquid crystal panel 100 and to an output terminal of the source driver 120.

The resistance of the resistor 13 is set so as to have a resistance that causes generation of impedance equivalent to internal impedance of the entire liquid crystal panel 100 while the electric charge moves to the source driver 120, via the inside of the liquid crystal panel 100 and the source line 111, in response to the charging of the liquid crystal panel 100.

A variable resistor can be used as the resistor 13. Further, it is preferable that such a variable resistor has a resistance which ranges from 1Ω to 100Ω. This is because the resistance of the variable resistor can be set so as to become equivalent to the internal impedance of the source lines 111. Note that the internal impedance of the source lines 111 can be found in accordance with factors such as structure and material of the liquid crystal panel 100.

The first connecting section 15 is a connecting line that has one end connected to one electrode of the switch 11, and the other electrode of the switch 11 is connected to the resistor 13. The other end of the first connecting section 15 can be connected to outside. While the switch 11 turns on, the electric charge is moved from the first connecting section 15, via the resistor 13 and the switch 11, in response to the discharging of the capacitor 12.

The second connecting section 16 is a connecting line that has one end connected to one electrode of the capacitor 12, and the other electrode of the capacitor 12 is connected to the resistor 13. In addition, the second connecting section 16 generates an application standard voltage of the application device 10. By setting the application standard voltage to GND (0V), it is possible to supply the electric charge to the second connecting section 16. The other end of the second connecting section 16 can be connected to outside, whereas the one end is connected to the capacitor 12 and a GND.

With the arrangement, in a case where a source driver 120 is connected between the first connecting section 15 and the second connecting section 16, the capacitor 12 is discharged, while the switch 11 turns on, so that a voltage is applied to the source driver 120. This causes the electric charge to move to the source driver 120.

Described below is an arrangement of the source driver 120 in which electric charge is supplied from outside and is supplied to outside.

The electric charge is inputted to and outputted from the source driver 120 via an IC socket. The reason why the IC socket is used is that the IC socket does not require any soldering and preparation of a plurality of evaluation boards, which are required in a case where the source driver 120 is mounted on the evaluation board for every evaluation.

The source driver 120 is attached to the IC socket without soldering. The IC socket is attached to the evaluation board without soldering. Further, since an evaluation board with the IC socket is used, it is possible to repeatedly use the IC socket and the evaluation board by replacing one source driver 120 with another.

The electrostatic discharge withstand voltage evaluating device of the present embodiment evaluates an electrostatic discharge breakdown withstand of a source driver 120 of a liquid crystal panel 100 by recreating how the above-mentioned failure occurs. The source driver 120 includes a plurality of output terminals connected to source lines 111 respectively. Therefore, the electric charge moves to all of the output terminals at a time during the discharge.

In order to recreate a situation in which the electric charge moves to the source driver 120, a part is secured at which wires extending from the output terminals of the source driver 120 are electrically connected to each other as shown in FIG. 1. Such a part can be connected to outside and is referred to as a common connecting section 51.

The common connecting section 51 can be realized by an arrangement in which the terminals of an IC socket are wired so that the output terminals of the source driver 120 are electrically connected to each other. Alternatively, the common connecting section 51 can be realized by an arrangement in which a printed board pattern of the evaluation board is carried out so that the output terminals of the source driver 120 can be electrically connected to each other at the terminals of the IC socket. These two arrangements can be realized at a low cost and can be practical, without further providing a switch or a relay on the evaluation board or in an evaluation device.

Instead, the common connecting section 51 can be realized by an arrangement in which (i) a plurality of terminals are drawn out from a plurality of terminals of the IC socket terminal so as to correspond respectively to the plurality of output terminals of the source driver 120; and (ii) a switch or a relay for controlling the plurality of terminals is provided on the evaluation board or in the evaluation device so that the plurality of terminals are electrically connected to each other at one terminal of the evaluation device. That is to say, the common connecting section 51 is not provided inside the source driver 120, but is provided on the evaluation board or in the evaluation device so that the wires extending from the output terminals of the source driver 120 are electrically connected to each other.

Terminals that can be connected to outside are drawn out from the IC socket to which the source driver 120 is attached. The terminals correspond to a plurality of input terminals of the source driver 120, respectively. Each of the terminals is referred to as a measuring terminal (a terminal to be measured) 52.

An IC socket can be suitably selected at least in accordance with (i) a shape and size of a measuring object device, i.e., the source driver 120 and (ii) an arrangement in which the wires extending from the plurality of output terminals of the measuring object device are electrically connected to each other.

In the arrangement, the first connecting section 15 of the application device 10 is connected to the common connecting section 51; and the second connecting section 16 of the application device 10 is connected to a measuring terminal 52 which is connected to a target input terminal to be evaluated out of the plurality of input terminals of the source driver 120.

After the connections of the first connecting section 15 and the second connecting section 16 are completed, respectively, an electrostatic pulse is outputted from the first connecting section 15 of the application device 10. As a result, electric charge moves to the source driver 120 since the first connecting section 15 is connected to the second connecting section 16, via the common connecting section 51, the output terminals of the source driver 120, an internal circuit of the source driver 120, the input terminal of the source driver 120, and the measuring terminal 52.

Specifically, in the application device 10, the switch 11 is turned off so that the capacitor 12 is charged by a certain voltage, and thereafter the switch 10 is turned on. In response to this, the capacitor 12 is discharged, so that a pulse voltage having an application time of several nanoseconds to 10 microseconds is applied to the source driver 120. Then, the switch 11 is turned off again so that the capacitor 12 is charged by a higher voltage than the previous one. It should be noted that the capacitor 12 is charged by a voltage which falls within a range from several ten V to several kilo V (30V to 1KV, for example).

The voltage across the capacitor 12 gradually increases while above charging and discharging of the capacitor 12 are repeated. This causes a pulse voltage to be repeatedly applied to the source driver 120. A pulse electric current gradually increases as the pulse voltage is applied to the source driver 120 like above.

The electric charge that moves and reaches the ground via the source driver 120 so as to actually cause a breakdown of the source driver 120 is a pulse electric charge. In view of this, an electrostatic discharge breakdown of the source driver 120 caused by the movement of the pulse electric charge is recreated, by supplying the electrostatic pulse from the application device 10 due to the discharging of the capacitor 12.

One discharging amount (i.e., electric charge amount) of the electrostatic pulse outputted from the application device 10 is equal to an amount of an electric charge that moves to the ground from the source lines 111, via the source driver 120 as described above with reference to FIG. 8, for example. Therefore, it is possible to quantitatively evaluate the electrostatic discharge breakdown withstand of the source driver 120, by judging the presence or absence of failure of the source driver 120 after the electrostatic pulse is applied to the source driver 120.

Further, it is possible to judge, by gradually increasing the pulse electric current, whether or not the electrostatic discharge breakdown of the source driver 120 occurs, based on a magnitude relation of (i) a maximum pulse electric current that the source driver 120, which is evaluated by the electrostatic discharge withstand voltage evaluating device of the present embodiment can withstand and (ii) an electrostatic discharge breakdown electric current that is actually generated in a production process of a display panel.

The second connecting section 16 of the application device 10 is connected to one of the measuring terminals 52 which is selected from the measuring terminals 52 that are provided so as to correspond to the plurality of input terminals of the source driver 120, respectively. This makes it possible to evaluate which line of the source driver 120 is easy to break down.

In this way, it is possible to evaluate the electrostatic discharge breakdown withstand voltage, by recreating a model in which the electric charge of the liquid crystal panel 100 moves to the source driver 120 from the source lines 111, and ultimately reaches the ground via a certain input terminal. This model is the same as each of the models described above with reference to FIGS. 8 through 10.

The electrostatic discharge withstand voltage evaluating device of the present embodiment is arranged so as to include: an application device 10 supplying a pulse electric current and including a first connecting section 15 and a second connecting section 16, the first connecting section 15 being connectable to output terminals of a source driver 120 and supplying an electric charge to the source driver 120, the second connecting section 16 being connectable to the terminal different from that to which the first connecting section 15 is connected and enabling the terminal connected to the second connecting section 16 to be grounded; and a common connecting section 51 being connectable to the plurality of the output terminals of the source driver 120 and electrically integrating the plurality of the output terminals, the output terminals of the source driver 120 being connected via the common connecting section 51 to the first connecting section 15.

With the arrangement, the capacitor 12 having a source line-ground equivalent capacitance C is connected in series with the resistor 13 that generates source line equivalent impedance Z, so that the capacitor 12 is discharged. By this, the electric charge which is discharged via the first connecting section 15 of the application device 10 can be set so as to become equivalent to an electric charge which moves from the liquid crystal panel 100 to the source driver 120 via the source lines 111.

Further, the first connecting section 15 of the application device 10 is connected to the common connecting section 51 at which the wires extending from the output terminals of the source driver 120 are electrically connected to each other; and the second connecting section 16 of the application device 10 is connected to a measuring terminal 52. Therefore, the electric charge which is discharged via the first connecting section 15 in response to the discharging of the capacitor 12 is supplied at a time, via the common connecting section 51, to all of the plurality of the output terminals of source driver 120. The electric charge moves to an internal line of the measuring object device, which line is connected to the measuring terminal 52.

With the arrangement, an electric charge of the liquid crystal panel 100 is discharged and applied at a time to the plurality of the output terminals of the source driver 120, and one of the input terminals of the source driver 120 is grounded. This makes is possible to more successfully recreate a situation in which the electric charge moves at a time to the one of the input terminals which is to be grounded.

Further, it is possible to evaluate an electrostatic discharge breakdown withstand of the source driver 120 with respect to each measuring terminal 52 which is connected to the second connecting section 16, with the use of an electric charge being supplied via the first connecting section 15 to an internal line of the source driver 120 in which the above-mentioned model is successfully recreated.

Therefore, the electrostatic discharge withstand voltage evaluating device of the present embodiment can more successfully recreate how a failure occurs in the source driver 120 and can evaluate the electrostatic discharge breakdown withstand of the source driver 120. That is, the electrostatic discharge withstand voltage evaluating device of the present embodiment deals with a new failure mode.

Figure 2:
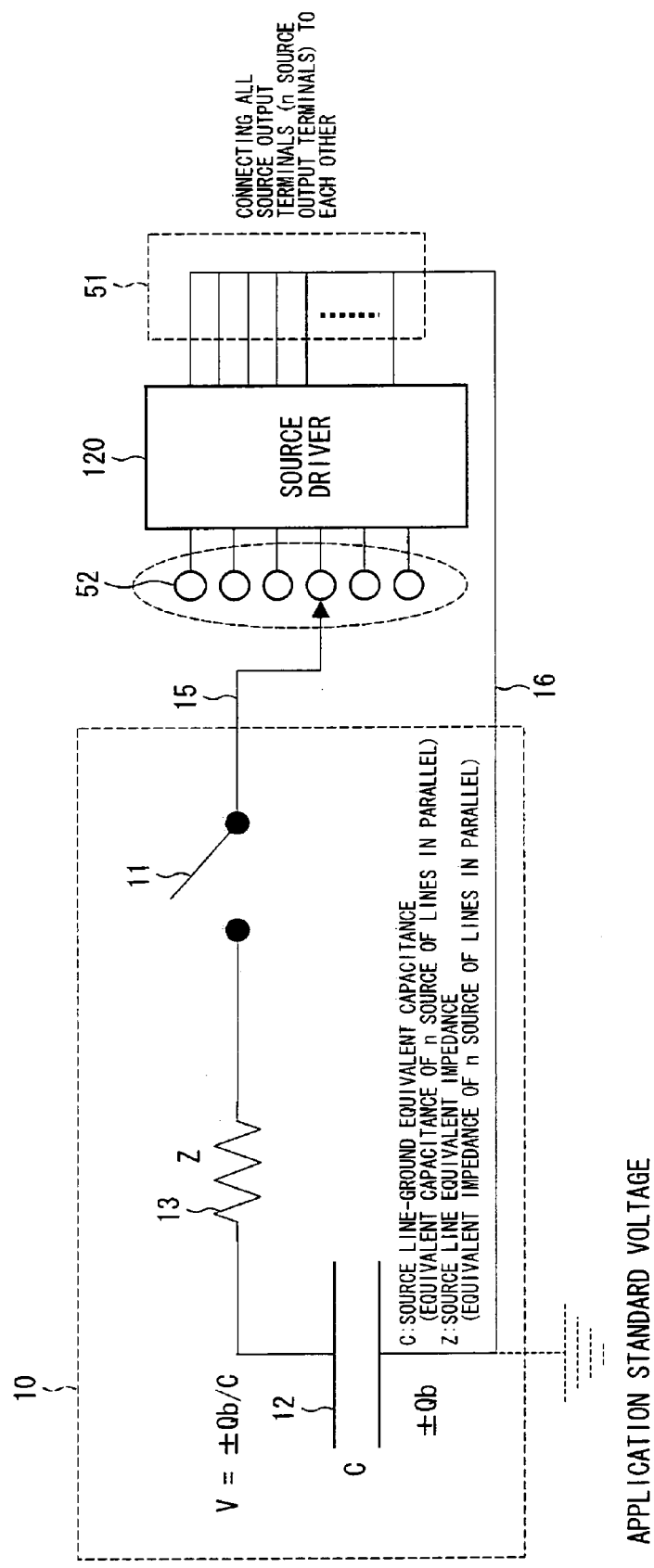
FIG. 2 is a block diagram illustrating another embodiment of an electrostatic discharge withstand voltage evaluating device of the present invention.

Further, the electrostatic discharge withstand voltage evaluating device of the present embodiment can be arranged so that the application device 10 supplies the electric charge to the source driver 120 in a direction opposite to one in the above-mentioned case as shown in FIG. 2.

FIG. 2 is a schematic view illustrating another arrangement of the electrostatic discharge withstand voltage evaluating device in accordance with the present embodiment.

According to the arrangement, a second connecting section 16 of an application device 10 is connected to a common connecting section 51, while a first connecting section 15 of the application device 10 is connected to a measuring terminal 52. This arrangement makes it possible to measure an electrostatic discharge breakdown withstand voltage of the source driver 120, on the assumption that a failure may occur in the source driver 120 by reason that the electric charge is moved to an input terminal of the source driver 120 due to some reason in a production process of a liquid crystal panel, for example.

As a result of study on process of electrostatic discharge breakdown of a liquid crystal panel, it became clear that internal impedance of a source line sometimes included inductance. In view of this, an electrostatic discharge withstand voltage evaluating device of the present embodiment can be arranged so that the application device 10 includes an inductor 14 as shown in FIG. 3.

Figure 3:
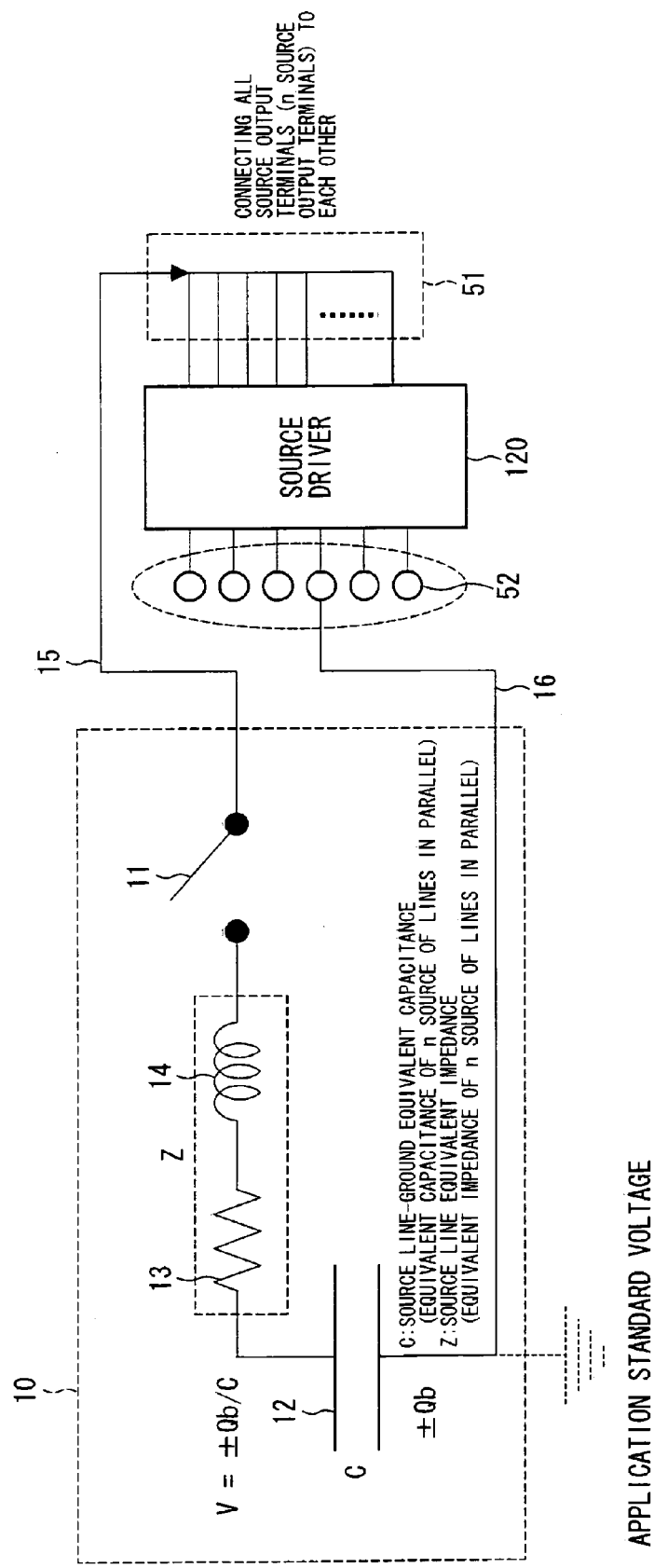
FIG. 3 is a block diagram illustrating still another embodiment of an electrostatic discharge withstand voltage evaluating device of the present invention.

FIG. 3 is a schematic view illustrating an arrangement in which an application device 10 includes an inductor 14.

The inductor 14 is provided between a resistor 13 and a switch 11 so as to be connected in series with a capacitor 12 and the resistor 13. The inductor 14 can be provided between the capacitor 12 and the resistor 13, provided that the inductor 14 is connected in series with the capacitor 12 and the resistor 13.

In the case where the inductance is included, it is preferable that the resistor having a resistance within a range from 1Ω to 100Ω is connected in series with the inductor 14 having an inductance of 0.1 μH to 10 μH. This is because it is possible to generate impedance equivalent to internal impedance of a source line 111.

In the electrostatic discharge withstand voltage evaluating device, the source driver 120 is used as the measuring object device. However, the present embodiment is not limited to this. It is also possible to achieve the same effect even in a case where a gate driver 130 is used as the measuring object device.

In the electrostatic discharge withstand voltage evaluating device, the electrostatic discharge breakdown withstand of the source driver 120 is measured by an arrangement in which the second connecting section 16 of the application device 10 is connected to one of the measured terminals 52 that are provided so as to correspond respectively to the plurality of input terminals of the source driver 120. However, the present embodiment is not limited to this. The second connecting section can be connected to a plurality of measuring terminals 52 so that the plurality of measured terminals 52 are collectively evaluated.

The resistor 13, or the resistor 13 and the inductor 14 function as determining how a voltage, applied between the first connecting section 15 and the second connecting section 16, changes over time while the capacitor 12 is discharged. Therefore, the measurement is not affected by place where the resistor 13, or the resistor 13 and the inductor 14 are provided in a discharging circuit. However, it should be noted that the direction in which a discharge current flows is determined in accordance with the place where the resistor 13, or the resistor 13 and the inductor 14 are provided in the discharging circuit.

The present invention is not limited to the embodiments above, but can be altered by a skilled person within the scope of the present invention.

INDUSTRIAL APPLICABILITY

The present invention can be applied to a reliability test for electrostatic discharge breakdown of a protection element of an input terminal, a power supply line and a GND line which are in a driving LSI for a display panel of a display such as a liquid crystal display or a plasma display. However, the present invention is not limited to this, and can be applied to other fields. For example, the present invention can be also applied to a semiconductor device that includes input and output terminals to which electric charge moves at a time, after the semiconductor device is charged and is then discharged during a production process.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. An electrostatic discharge withstand voltage evaluating device for evaluating an electrostatic discharge withstand voltage of a measuring object device that includes a plurality of input terminals and a plurality of output terminals, the electrostatic discharge withstand voltage evaluating device comprising:
application means, including a first connecting section and a second connecting section, for supplying pulse electric charge,
the first connecting section being connectable to one or whole terminal(s) of one of the plurality of input terminals and the plurality of output terminals, and supplying electric charge to the measuring object device,
the second connecting section being connectable to one or whole terminal(s) of the other one of the plurality of input terminals and the plurality of output terminals, and enabling said one or whole terminal(s) of the other one of the plurality of input terminals and the plurality of output terminals to be grounded; and
a common connecting section being connectable to the plurality of the output terminals of the measuring object device, and causing the plurality of output terminals to be electrically connected to each other,
the plurality of output terminals of the measuring object device being connected, via the common connecting section, to one of the first connecting section and the second connecting section.

2. The electrostatic discharge withstand voltage evaluating device according to claim 1, wherein the measuring object device is a display driving semiconductor device to be provided in a display panel.

3. The electrostatic discharge withstand voltage evaluating device according to claim 2, wherein:
the application means includes a capacitive element for accumulating the electric charge;
in a case where the display driving semiconductor device is provided on the display panel, a capacitance of the capacitive element can be set so as to be equivalent to an electric charge amount that is accumulated while the display panel is electrically charged.

4. The electrostatic discharge withstand voltage evaluating device according to claim 3, wherein the capacitance of the capacitive element is 1 pF to 1 μF.

5. The electrostatic discharge withstand voltage evaluating device according to claim 3, wherein:
the application means includes an impedance element generating impedance that can be set so as to be equivalent to internal impedance of the display panel in the case where the display driving semiconductor device is provided in the display panel.

6. The electrostatic discharge withstand voltage evaluating device according to claim 2, wherein:
the application means includes an impedance element generating impedance that can be set so as to be equivalent to internal impedance of the display panel in the case where the display driving semiconductor device is provided in the display panel.

7. The electrostatic discharge withstand voltage evaluating device according to claim 6, wherein the impedance is provided by a resistor of 1Ω to 100Ω.

8. The electrostatic discharge withstand voltage evaluating device according to claim 7, wherein the impedance further includes an inductor of 0.1 μH to 10 μH which is connected in series.

9. An electrostatic discharge withstand voltage evaluating device for evaluating an electrostatic discharge withstand voltage of a measuring object device that includes a plurality of input terminals and a plurality of output terminals, the electrostatic discharge withstand voltage evaluating device comprising:

application means, including a first connecting section and a second connecting section, for supplying pulse electric charge, the first connecting section being connectable to one or whole terminal(s) of one of the plurality of input terminals and the plurality of output terminals, and supplying electric charge to the measuring object device, the second connecting section being connectable to one or whole terminal(s) of the other one of the plurality of input terminals and the plurality of output terminals, and enabling said one or whole terminal(s) of the other one of the plurality of input terminals and the plurality of output terminals to be grounded; and a common connecting section being connectable to the plurality of the output terminals of the measuring object device, and causing the plurality of output terminals to be electrically connected to each other, the plurality of output terminals of the measuring object device being connected, via the common connecting section, to one of the first connecting section and the second connecting section, the other one of the first connecting section and the second connecting section being selectively connectable to one of the plurality of input terminals.

10. An electrostatic discharge withstand voltage evaluating method for evaluating an electrostatic discharge withstand voltage of a measuring object device that includes a plurality of input terminals and a plurality of output terminals, the electrostatic discharge withstand voltage evaluating method comprising the steps of:

connecting the plurality of output terminals to a common connecting section for causing the plurality of output terminals to be electrically connected to each other; and supplying pulse electric charge to one or whole terminal(s) of one of the plurality of output terminals connected to the common connecting section and the plurality of input terminals, and grounding one or whole terminal(s) of the other one of the plurality of output terminals connected to the common connecting section and the plurality of input terminals.

11. The electrostatic discharge withstand voltage evaluating method according to claim 10, wherein:

in a case where the pulse electric charge is supplied to the plurality of output terminals connected to the common connecting section, one of the plurality of input terminals is selectively grounded; and in a case where the plurality of output terminals connected to the common connecting section are grounded, the pulse electric charge is selectively supplied to one of the plurality of input terminals.

12. The electrostatic discharge withstand voltage evaluating method according to claim 11, wherein the measuring object device is a display driving semiconductor device to be provided in a display panel.

13. The electrostatic discharge withstand voltage evaluating method according to claim 10, wherein the measuring object device is a display driving semiconductor device to be provided in a display panel.

* * * * *